United States Patent [19]

Harnden, Jr. et al.

[11] Patent Number: 4,658,154

[45] Date of Patent: Apr. 14, 1987

[54] PIEZOELECTRIC RELAY SWITCHING CIRCUIT

[75] Inventors: John D. Harnden, Jr., Schenectady; William P. Kornrumpf, Albany, both of N.Y.

[73] Assignee: General Electric Company, Schenectady, N.Y.

[21] Appl. No.: 811,782

[22] Filed: Dec. 20, 1985

[51] Int. Cl.[4] .............................................. H01L 41/08

[52] U.S. Cl. ................................ 307/132 R; 307/400; 200/181; 310/332; 310/316; 310/317

[58] Field of Search ............... 307/132 R, 400, 252 N; 310/316, 317, 318, 319, 325, 326, 327, 328, 329, 330, 331, 332, 333, 334, 336, 337, 338; 200/181; 361/160, 207, 208, 209

[56] References Cited

U.S. PATENT DOCUMENTS

| | | | |
|---|---|---|---|
| 2,166,763 | 7/1939 | Mason | 175/320 |
| 2,195,417 | 4/1940 | Mason | 179/86 |
| 3,066,232 | 11/1962 | Branson | 310/8.7 |
| 3,405,289 | 10/1968 | Gikow | 200/181 X |
| 3,462,939 | 8/1969 | Tanaka et al. | 310/328 X |
| 3,582,733 | 6/1971 | Brubaker | 310/316 X |
| 3,681,626 | 8/1972 | Puskas | 310/316 |
| 3,777,093 | 12/1973 | Sterns et al. | 200/181 |
| 3,815,129 | 6/1974 | Sweany | 310/316 X |
| 4,044,297 | 8/1977 | Nobue et al. | 310/317 X |
| 4,054,848 | 10/1977 | Akita | 310/317 X |
| 4,081,706 | 3/1978 | Edelson | 310/316 |
| 4,093,883 | 6/1978 | Yamamoto | 310/317 |
| 4,112,433 | 9/1978 | Vernon | 310/317 X |
| 4,376,255 | 3/1983 | Kleinschmidt | 310/317 |
| 4,395,651 | 7/1983 | Yamamoto | 310/311 |
| 4,403,166 | 9/1983 | Tanaka et al. | 310/332 |
| 4,461,968 | 7/1984 | Kolm et al. | 310/332 |
| 4,520,289 | 5/1985 | Sato et al. | 310/332 X |
| 4,529,904 | 7/1985 | Hattersley | 310/318 |
| 4,565,940 | 1/1986 | Hubbard | 310/326 |
| 4,568,849 | 2/1986 | Sato et al. | 200/181 X |

*Primary Examiner*—William M. Shoop, Jr.
*Assistant Examiner*—Shik Luen Paul Ip
*Attorney, Agent, or Firm*—J. F. McDevitt; Philip L. Schlamp; Fred Jacob

[57] ABSTRACT

To control the operation of a piezoelectric relay, control circuitry is disclosed for direct ohmic connection to a utility AC source to draw the minimal power required to actuate the relay's bimorph member pursuant to selectively switching power current through either one of two separate loads. The control circuitry, which is largely implimented in a single integrated circuit chip, utilizes isolating resistance and the capacitances of a voltage doubler circuit and the piezoceramic plate elements for transient suppression and circuit protection.

18 Claims, 2 Drawing Figures

PIEZOELECTRIC RELAY SWITCHING CIRCUIT

Figure 1:
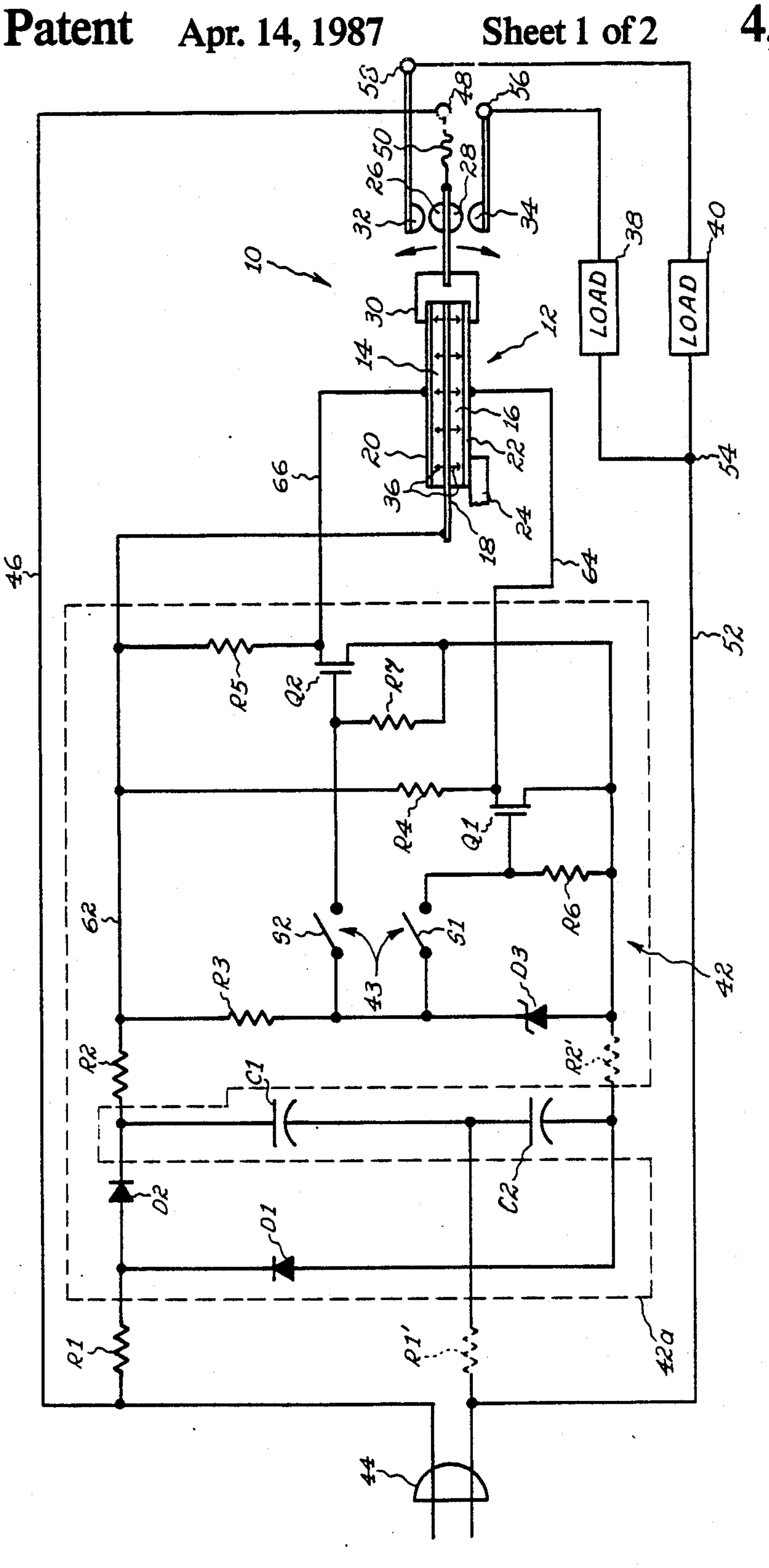

The present invention relates to piezoelectric relays and particularly to high voltage, solid state circuitry for controlling the operation of such relays.

Electromagnetic relays are commonly used as switching components for controlling current flow in load circuits in response to control signals. Thus, such relays are well suited to serve as an interface between, for example, an electronic control circuit and a load circuit wherein the former handles the low power control signals for selectively energizing the relay coil to appropriately position the relay contacts acting in the power circuit to switch relatively higher levels of power. While the relay contacts are closed, load current is conveyed, with virtually no losses, and when they are parted, load current is interrupted with the certainty only an air gap can provide. Over the years, improvements in electromagnetic relays have resulted in increased efficiency and reduced physical size. That is, such relays can be actuated with control signals of rather low energy content to switch reasonably high levels of load current. For example, electromagnetic relays are available which can be actuated by a one watt control signal to switch two kilowatts of power at 120 or 240 VAC. As a consequence, electromagnetic relays can be operated by signals generated by solid state control circuitry.

Electromagnetic relays do however have their drawbacks. Although they have been miniaturized as compared to earlier relay designs, their actuating power requirements are quite large in contrast to, for example, comparable, state of the art solid state power switches. Such relays are relatively complex and expensive to manufacture, for example, their coils typically require a multitude of turns of very fine wire. The coil resistance, though low, nevertheless consumes some power which must be provided by a reasonably stiff power supply. When, for example, electromagnetic relays are utilized in home appliance controls, relay operating power must be derived from a 120 or 240 VAC utility source. The requisite power supply, particularly when an electromagnetic relay is wedded with a solid state control circuit, requires a transformer, electrolytic capacitors, regulators and protectors to insure a reliable source of relay actuating current. Such power supplies thus are costly and constitute a significant source of power dissipation. Moreover, in certain applications where high ambient magnetic fields are present, such as in motor starter applications, electromagnetic relays must be specially shielded to discourage spurious operation.

Recently, there has been a trend toward utilizing solid state switches, such as SCRs, Triacs, thyristors, MOSFETs, IGTs and the like, in power switching applications previously served by electromagnetic relays. While such power switches are becoming relatively inexpensive and are smaller in physical size than comparably rated electromagnetic relays, they do present a rather significant "on" resistance, which, at high current levels, results in considerable power dissipation. Thus, semiconductor power switches utilized in high current applications must be properly heat-sinked for protection against thermally induced damage, and, as consequence, with their heat sinks can take up more space than do their relay counterparts. Moreover, solid state power switches must be protected against possible damage and spurious operation as the result of transients, electrostatic discharges (ESD) and electromagnetic interference (EMI). All of these protective measures represent additional expense. The fact that such power switches do not impose an air gap to restrain the flow of current in their "off" states has led to Underwriters Laboratory disapproval of their application in some domestic appliances.

The various drawbacks of electromagnetic relays and semiconductor devices as power switching output devices, including those mentioned above, have prompted renewed interest in piezoelectric relays. Recent improvements in piezo-ceramic materials have enhanced their electromechanical efficiency for relay applications. Piezoelectric drive elements may be fabricated from a number of different polycrystalline ceramic materials such as barium titanate, lead zirconate titanate, lead metaniobate and the like which are precast and fired into a desired shape, such as retangular-shaped plates. Piezoelectric relays require very low actuating current, dissipate minimal power to maintain an actuated state, and draw no current while in their quiescent state. The electrical characteristics of piezoelectric drive elements are basically capacitive in nature, and thus are essentially immune to ambient electromagnetic fields. Piezoelectric relays can be designed in smaller physical sizes than comparably rated electromagnetic relays. Since piezoelectric relays utilize switch contacts in the manner of electromagnetic relays, contact separation introduces an air gap in the load circuit as is required for UL approval in most domestic appliance applications. Closure of the relay contacts provides a current path of negligible resistance, and thus, unlike solid state power switches, introduce virtually no loss in the load circuit.

While piezoelectric relays posses the above-noted advantages over electromagnetic relays and solid state power switches, it remains to provide a suitable control circuit for actuating the piezoceramic drive elements of a piezoelectric relay in order to achieve desired current switching functions. Accordingly, it is a principal object of the present invention to provide an improved control circuit for selectively actuating a piezoelectric relay.

An additional object is to provide a piezoelectric relay control circuit which is simple in construction, inexpensive to manufacture, and reliable in operation over a long service life.

Another object of the present invention is to provide a piezoelectric relay control circuit of the above-character which is effective in rendering the relay immune to spurious external influences.

A further object is to provide a piezoelectric relay control circuit of the above-character which is constructed in a cost effective manner to be directly ohmically connected to and thus powered directly from conventional utility AC power sources.

Another object is to provide a piezoelectric relay control circuit of the above-character which requires minimal operating power.

Other objects of the invention will in part be obvious and in part appear hereinafter.

SUMMARY OF THE INVENTION

In accordance with the present invention, a piezoelectric relay is provided having an actuating mechanism in the form of a pair of pre-polarized piezoceramic plate elements bonded together in sandwich fashion with an intervening common surface electrode. Separate electrodes are applied to the opposite, exposed surfaces of the plate elements to achieve a known, basic bimorph configuration. The piezoceramic bimorph is mounted cantilever fashion and carries at its free end a contact for movement between circuit making and circuit breaking positions with respect to at least one stationary contact to control current flow in a load circuit.

To control the piezoelectric relay pursuant to effecting selected load current switching functions, circuitry is provided for direct ohmic connection to a conventional AC power source, and which is selectively operable to apply a DC electric field across the individual piezoceramic plate elements always in the same direction as the elements were prepolarized. Thus depolarization over time of the plate elements is avoided. This circuitry includes high voltage integrated circuit active elements in combination with a simple voltage conversion input circuit, whereby the piezoelectric relay can draw the minimal actuating power it requires directly from a conventional 120 or 240 VAC residential source. The control circuitry is ideally suited for implimentation in a single integrated circuit chip.

The invention accordingly comprises the features of construction, arrangements of parts and combinations of elements which will be exemplified in the constructions hereinafter set forth, and the scope of the invention will be indicated in the claims.

Figure 2:
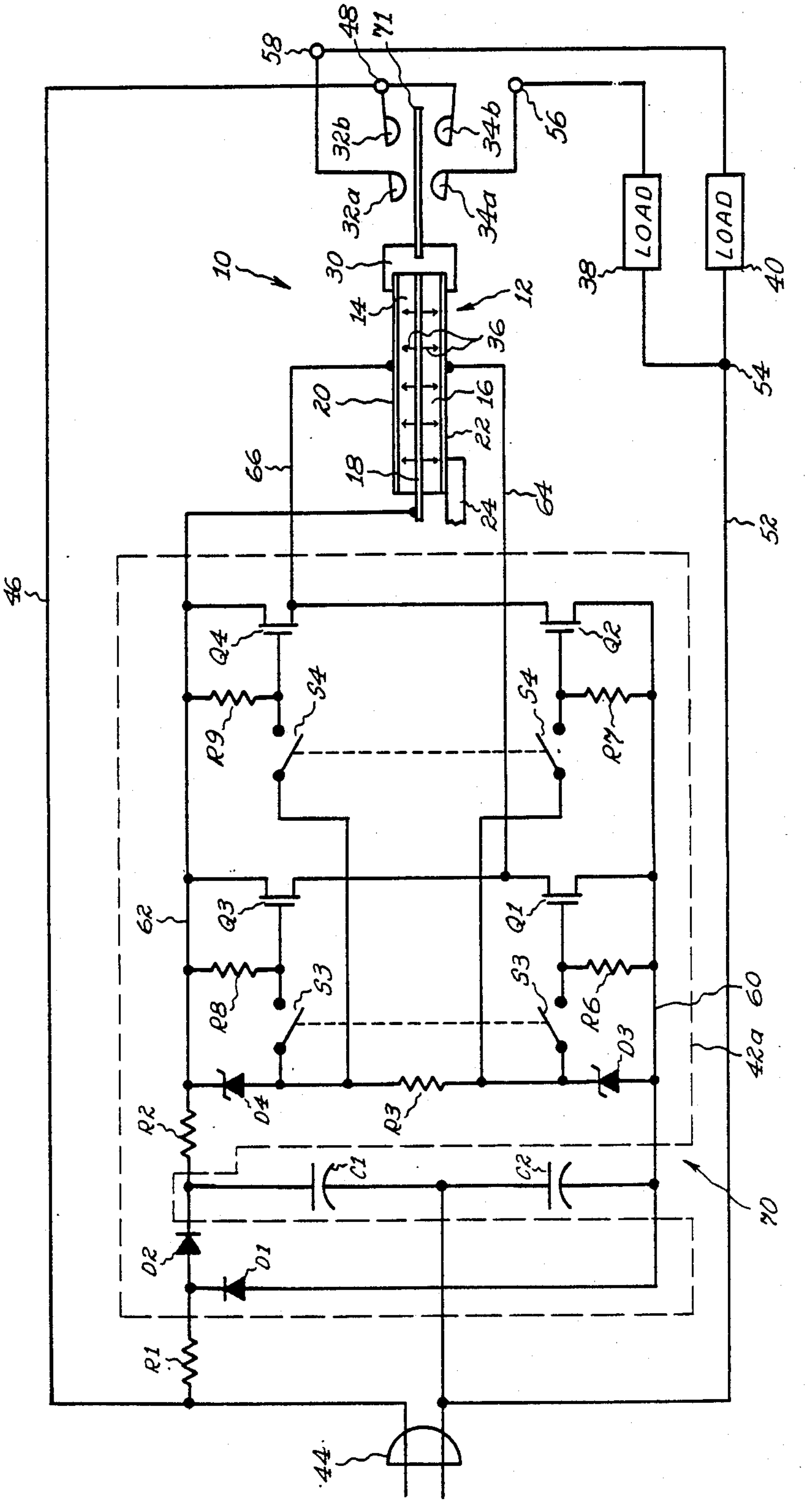

For a better understanding of the nature and objects of the present invention, reference should be had to the following detailed description taken in conjunction with the accompanying drawing, in which:

FIG. 1 is a circuit schematic diagram of a piezoelectric relay switching circuit constructed in accordance with one embodiment of the invention; and FIG. 2 is a circuit schematic diagram of an alternate embodiment of the invention.

Like reference numerals refer to corresponding parts throughout the several views of the drawing.

DETAIL DESCRIPTION

Referring to FIG. 1, a piezoelectric relay, generally indicated at 10, includes a bimorph actuator member, generally indicated at 12, which consists of a pair of piezoceramic plates 14 and 16 bonded together in sandwich fashion with a common, intervening surface electrode 18. The exposed upper surface of plate 14 is coated with a conductive material to provide an electrode 20, while the exposed lower surface of plate 16 is similarly electroded, as indicated at 22. The plates are formed of known piezoceramic materials such as lead zirconate titanate, lead metaniobate and barium titanate, while the surface electrodes are provided by deposited coatings of suitable conductive materials such as nickle, silver and the like.

Actuator member 12 is cantilever mounted at one end, as indicated at 24, while its free end supports a pair of opposed contacts 26 and 28 via an electrically insulative holder 30. The actuator member is shown in its unactuated, center "off" position with a stationary contact 32 disposed in spaced relation above contact 26 and a stationary contact 34 disposed in spaced relation below contact 28. It will be understood the spatial orientation shown for relay 10 is merely illustrative, as it is quite capable of operation in any orientation. Arrows 36 show the polarity of the pre-polarizing electric fields imposed across piezoceramic plates 14 and 16 during fabrication of actuator member 12, which is assumed to have been generated by applying a relatively positive voltage to common electrode 18 and relatively negative potentials to electrodes 20 and 22. As will be appreciated from the description below, the prepolarized polarities of the plates are determined pursuant to optimization of the control circuit design. For a more detailed discussion of the construction and operation of piezoelectric relay 10, reference may be had to applicants' commonly assigned, copending application entitled "Improved Piezoelectric Ceramic Switching Devices and Systems and Methods of Making the Same", Ser. No. 685,109, filed Dec. 21, 1984. With the indicated plate prepolarization, when an electric field is developed across plate 14 of the same polarity as its prepolarized polarity, i.e., electrode 18 at a more positive potential than electrode 20, this plate expands in the direction perpendicular to the plane of the electrodes (increases in thickness) and contacts in the direction parallel to the plane of the electrodes (decreases in length from its mounted end to its free end). As a consequence, actuator member 12 defects upwardly to make contacts 26 and 32 and thereby complete a power circuit for a load 40. On the other hand, if a more positive potential is applied to electrode 18 than is applied to electrode 22, piezoceramic plate 16 undergoes the same distortion causing the actuator member to deflect downward and make contacts 28 and 34. A power circuit is thus completed for a load 38. Upon removal of these electrode potentials, actuator member 12 reverts to its center "off", quiescent position shown in FIG. 1 with ample air gaps separting the two sets of stationary and movable contacts.

To control the operation of piezoelectric relay 10 there is provided, in accordance with the present invention, a control circuit, generally indicated at 42, which utilizes active elements constructed using high voltage integrated circuit technology to achieve low power consumption while being powered directly from a conventional utility source, e.g., 120 or 240 VAC. Numerous processes are known for producing high voltage, low current devices applicable to the present invention, such as CMOS, DMOS, PMOS, NMOS, etc. By high voltage, low current is meant voltages in the 300 to 600 volt range and currents in the milliamp range. Suitable candidates are the monolithic DMOS FET arrays offered by Supertex Inc., 2NT001, 2, 2 MOS-FETs offered by Siliconex, and ETN012P3 GTO transistor arrays offered by Hitachi.

As seen in FIG. 1, control circuit 42 is equipped with a conventional male plug 44 for tapping into a conventional 120 or 240 VAC power source, not shown. One blade of the plug is connected by a power circuit lead 46 to a relay terminal 48, which, in turn, is connected via a flexible pigtail conductor 50 to the set of movable contacts 26 and 28. The other blade of plug 44 is connected via power circuit conductor 52 to a junction 54 common to one side of each of loads 38 and 40. The other side of load 38 is connected to relay terminal 56 to which stationary contact 34 is brought out, while the other side of load 40 is connected to relay terminal 58 to which stationary contact 32 is brought out. It is thus seen that when relay contacts 26, 32 touch, current from the AC source is switched through load 40. On the other hand, current is switched through load 38 when relay contacts 28, 34 touch. In the center "off", quiescent relay position shown, neither load is energized.

To power control circuit 42, the blade of plug 44 connected with conductor 46 is also directly ohmically connected through a current limiting, isolating resistor R1 to the junction between diodes D1 and D2. The anode of diode D1 is connected to a negative voltage bus 60, while the cathode of diode D2 is connected through a resistor R2 to a positive voltage bus 62. The junction between diode D2 and resistor R2 is connected to negative bus 60 by a pair of series connected capacitors C1 and C2. The junction between these capacitors is connected to the blade of plug 44 connected with power circuit conductor 52. It will be recognized by those skilled in the art that diodes D1, D2 and capacitor C1, C2 are interconnected to function as a voltage doubler. Other voltage doubler configurations are known in the art and may be utilized herein. If piezoelectric relay 10 requires higher DC activating voltages, voltage triplers and even quadruplers would be utilized. It will be appreciated that if the source AC voltage is sufficiently high such that the requisite relay activating voltage can be obtained directly therefrom, simple rectification would suffice.

Still referring to FIG. 1, connected across buses 60 and 62 is the series combination of a resistor R3 and a zener diode D3, the series combination of a resistor R4 and an FET transistor Q1, and the series combination of a resistor R5 and an FET transitor Q2. The gates of transistors Q1 and Q2, which are N type in the illustrated embodiment, are referenced to negative DC bus 60 via a resistor R6 and a resistor R7, respectively. The gate of transistor Q1 is also connected via a normally open, manually operable switch S1 to the junction between resistor R3 and zener diode D3, as is the gate of transistor Q2 via a normally open, manually operable switch S2. The source of transistor Q1 is connected via a lead 64 to surface electrode 22 of plate 16, while the source of transistor Q2 is connected via lead 66 to surface electrode 20 of plate 14. Finally, positive DC bus 62 is connected to the common electrode 18 of plates 14, 16 of relay 10.

It will be appreciated that while FET transistors are shown, other forms of high voltage integrated circuit active devices may be used. Also, the switches S1 and S2 in many applications will consist of solid state switches operating in response to externally derived condition responsive sensor output signals and user adjustment functions symbolically indicated by arrows 43 in FIG. 1 herein, and, for example as disclosed in U.S. Pat. No. 3,524,997.

In the operation of control circuit 42, when switch S1 is closed, the regulated voltage appearing at the cathode of zener diode D3 is applied to the gate of transistor Q1. This transistor is turned on to apply the voltage on negative bus 60 to surface electrode 22 of piezoceramic plate 16. Since its opposing surface electrode 18 is connected with positive DC voltage bus 62, the full voltage between buses 62 and 60, to which capacitors C1 and C2 are charged, is applied across plate 16. These capacitors begin discharging to supply charging current to plate 16 through resistor R2. An electric field is thus developed in plate 16 having the same polarity as the plate's prepolarized polarity. This plate distorts in the manner described above causing actuator member 12 to deflect downwardly. Relay contacts 28, 34 touch to complete the power circuit for load 38. As long as switch S1 remains closed to maintain the charge on plate 16, closure of contacts 28, 34 is continued and load 38 remains energized. Leakage current is minimal, and thus very little power is required to sustain a closed relay condition. The only appreciable current drawn from the simple voltage doubler power supply is upon closure of switch S1 to initially charge plate 16 plus the current drain posed by resistor R4 while transistor Q1 is conductive, however these currents typically total less than 15 milliamps. Thus total control power dissipation is exceptially low, a matter of milliwatts.

As can be readily seen from FIG. 1, to make relay contacts 26,32, switch S2 is closed to render transistor Q2 conductive and thus charge plate 14. The consequent distortion of this piezoceramic plate produces upward deflection of bender member 12, whereupon contacts 26 32 close to complete the power circuit for load 40 from the source. When either switch S1 or S2 is reopened to turn off its associated transistor, it is seen that the bender plates are discharged through either resistors R4 or R5, and actuator member 12 returns to its illustrated center off, neutral position to interrupt the flow of load current. The abruptness of this return is controlled by the resistance value of resistors R4 and R5. It is important to note that a control circuit failure will typically result in removal of charging voltage from the plates. The actuator member will thus assume its center off position, which is a fail safe feature of the present invention. Also contributing to the inherent fail-safe character of the present invention is the fact that relay 10 can energize only one load at a time.

Turning to FIG. 2, there is shown a control circuit 70 whose construction basically differs from control circuit 42 of FIG. 1 only in the substitution of active discharge devices, P type FET transistors Q3 and Q4 in the illustrated embodiment, for the passive plate discharging resistors R4 and R5. To this end, it is seen that transistors Q1 and Q3 are connected in series across busses 60, 62, as is the series combination of transistors Q2 and Q4. The gates of transistor Q3 and Q4 are separately connected to bus 62 by resistors R8 and R9, respectively. To accommodate triggering of transistors Q3 and Q4, as well as transistors Q1 and Q2, an additional zener diode D4 is connected in series between resistor R3 and bus 62. A switch S3 is connected to apply in one of its positions the triggering voltage at the cathode of zener diode D3 to the gate of transistor Q1 and thus charge plate 16. When it is desired to discharge this plate, switch S3 is repositioned to remove the zener regulated voltage from transistor Q1 and apply the zener regulated voltage at the anode of diode D4 to the gate of transistor Q3. This latter transistor is thus turned on to provide a path of negligible resistance for abruptly discharging plate 16. Switch S4 is positioned to apply gate voltage to transistor Q2 and charge plate 14, and subsequently positioned to apply gate voltage to transistor Q4 and thus abruptly discharge this plate. With the switches in their illustrated open positions, all of the transistors are rendered nonconductive. The use of these active discharge transistors avoids the constant current drain imposed by the presence of resistors R4 and R5 in FIG. 1 while the relay is being actuated. Thus, power consumption is even lower for the control circuit of FIG. 2, enabling the utilization of higher isolating resistance in the power supply. Consequently, the voltage doubler power supply in FIG. 2 is virtually ripple-free. By coordinating the operations of switches S3 and S4 such that, when one of the plates is being charged, the other is short circuited through its associated transistor Q3, Q4, bimorph creep is precluded.

FIG. 2 also illustrates an alternative relay contact design wherein the equivalent of stationary relay contacts 32 and 34 in FIG. 1 are provided as separate pairs of closely spaced, stationary contacts **32*a*, 32*b*** and 34*a*, 34*b*. Contacts 32*b* and 34*b* are commonly connected to relay terminal 48, while contacts 32*a* and 34*a* are respectively connected to terminals 58 and 56. By virtue of this design, actuator member 12 can be equipped with a movable contact in the form of a shorting bar 71 which either selectively bridges contacts 32*a* and 32*b* to power load 40 or contacts 34*a* and 34*b* to power load 38, upon activation of relay 10. The advantage of this contact design is that the actuator member does not have to cope with the additional mass and compliance of pigtail 50 in the FIG. 1 relay contact design.

It will be noted that the simple voltage doubler power supply of FIGS. 1 and 2 is devoid of circuitry devoted to overvoltage and overcurrent protection, crowbarring, and other protective measures, which is deemed to be unnecessary. Since the current handling requirements are so low, except for resistor R1 and capacitors C1, C2 which are too large, the integrated circuit elements can be implimented in a single, very compact, low cost control circuit chip indicated by the dashed line rectangle 42*a*. The RC time constants of the control circuit and the relay plates effectively attenuate electrical noise. Moreover, the high isolating resistance (resistor R1 at least 33 kilohms and resistor R2 at least 10 kilohms) and abundant capacitance of the control circuit power supply affords effective immunity to high voltage switching transisents, electromagnetic interferences, and electrostatic discharges. It will be noted that the load current conductors 46 and 52 can be readily isolated from the power supply inputs, thus reducing the possibility of inductive and capacitive coupling of noise into the control circuit.

It is important to note that the control circuit is devoid of inductive components, particularly a transformer, and thus it can be characterized as being directly, ohmically connected with the AC source. When plug 44 is plugged into a 240 VAC residential source, the control circuit is essentially floating, and thus it would be desirable to split the resistances of isolating resistor R1 and charging resistor R2 between the two sides of the circuit, as indicated by the resistors R1′ and R2′ shown in phantom in FIG. 1. This is also desirable if plug 44 is not polarized, and thus the plug blade connected to the junction of capacitors C1 and C2 may not be solidly tied to ground. While not shown, the control circuit may include snubber circuitry to minimize relay contact arcing, such as disclosed in our above-noted copending application.

It will thus be seen that the objects set forth above, including those made apparent from the preceding description, are efficiently attained and, since certain changes may be made in the above constructions without departing from the scope of the invention, it is intended that all matter contained in the above description or shown in the accompanying drawing shall be interpreted as illustrative and not in the limiting sense.

Having described our invention, what we claim and desire to secure by Letters Patent is:

1. A relay switching circuit for controlling the flow of power current to a load, said circuit comprising in combination:

A. a piezoelectric relay including
   (1) a first terminal for conection to a source of power,
   (2) a second terminal for connection to a load,
   (3) a bimorph actuator member having first and second prepolarized poezoceramic plates,
   (4) a movable contact,
   (5) at least one stationary contact,
   (6) said actuator members in its quiescent state supporting said movable contact in spaced relation to said stationary contact; and B. relay control circuitry including
   (1) a voltage conversion circuit for direct ohmic connection to a utility source of AC voltage and connected to said actuating member, said voltage conversion circuit having a diode-capacitor network for developing a high DC supply voltage,
   (2) a high voltage integrated circuit connected with said voltage conversation circuit and including at least one active device connected with said actuator member, and
   (3) means activating said active device to selectively apply said supply voltage across one of said first and second plates,
   (4) whereby said actuator member deflects to position said movable contact in engagememnt with said stationary contact to thereby complete a circuit between said first and second relay terminals connecting the source with the load.

2. The relay switching circuit defined in claim 1, wherein said active device applies said supply voltage across said one plate with a polarity corresponding to the prepolarized polarity thereof.

3. The relay switching circuit defined in claim 2, wherein said control circuitry further includes a resistor connected to discharge said one plate when said active device is controlled by said activating means to remove said supply voltage from said one plate.

4. The relay switching circuit defined in claim 2, wherein said integrated circuit further includes an additional active device responsive to said activating means to provide a short circuit discharge path forsaid one plate when said supply voltage is removed from said one plate.

5. The relay switching circuit defined in claim 1, wherein said control circuitry includes a series isolating resistor for limiting the current drawn from the utility AC source.

6. The relay switching circuit defined in claim 5, wherein said isolating resistor has a resistance value of at least 33 kilohms, whereby to minimize the power consumption of said control circuitry.

7. The relay switching circuit defined in claim 5, wherein at least one capacitor of said diode-capacitor network is connected to be charged through said isolating resistor when said actuator is in its said quiescent state to develop said supply voltage, said capacitor discharging to supply charging current to said one plate upon activation of said active device.

8. The relay switching circuit defined in claim 7, wherein said control circuit circuitry further includes a charging resistor connected to conduct said charging current to said one plate.

9. A relay switching circuit for selectively switching power current to either of first and second loads, said circuit comprising, in combination:

A. a piezoelectric relay including
   (1) a first terminal for connection to a source of power,
   (2) a source terminal for connection to the first load,
   (3) a third terminal for connection to the second load, (4) a bimorph member having first and second prepolarized piezoceramic plates,
(5) at least one movable contact,
(6) at least one first stationary contact,
(7) at least one second stationary contact,
(8) said bimorph member in its quiescent state supporting said movable contact in spaced relation to said first and second stationary contacts; and B. relay control circuitry including
(1) a voltage conversion circuit for direct ohmic connection to a utility source of AC voltage and connected to said bimorph member, said voltage conversion circuit having a diode-capacitor network for developing a high DC supply voltage,
(2) a high voltage integrated circuit connected with said voltage conversion circuit and including first and second active devices connected with said bimorph member, and
(3) switching means controlling said first and second active devices to selectively apply said supply voltage across one or the other of said first and second plates;
(4) whereby to cause said bimorph member to deflect in a first direction to engage said movable and said first stationary contacts to thereby complete a circuit between said first and second terminals to switch power current to the first load or to deflect in a second direction to engage said movable and said second stationary contacts to thereby complete a circuit between said first and third terminals to switch power current to the second load.

10. The relay switching circuit defined in claim 9, wherein said first and second active devices apply said supply voltage across either said first or second plates with a polarity corresponding to the prepolarized polarities thereof.

11. The relay switching circuit defined in claim 9, wherein said control circuitry further includes a first resistor connected to discharge said first plate when said first active device is controlled by said switching means to remove said supply voltage from across said first plate and a second resistor connected to discharge said second plate when said second active device is controlled by said switching means to remove said supply voltage from across said second plate.

12. The relay switching circuit defined in claim 9, wherein said integrated circuit further includes a third active device conditioned by said switching means to discharge said first plate when said first active device is controlled to remove said supply voltage from across said first plate, and a fourth active device conditioned by said switching means to discharge said second plate when said second active device is controlled to remove said supply voltage from across said second plate.

13. The relay switching circuit defined in claim 9, wherein said first and second loads and said control circuitry are all powered from the utility AC source.

14. The relay switching circuit defined in claim 9, wherein said control circuitry includes a series isolating resistor for limiting the current drawn from the utility AC source.

15. The relay switching circuit defined in claim 14, wherein at least one capacitor of said diode-capacitor network is connected to be charged through said isolating resistor when said bimorph member is in its said quienscent state to develop said supply voltage, said capacitor discharging to supply charging current to one of said plates upon activation of one of said active devices.

16. The relay switching circuit defined in claim 15, wherein said control circuitry further includes a charging resistor connected to conduct said charging current to said plates.

17. The relay switching circuit defined in claim 9, wherein said relay is incapable of completing a circuit between said first and second terminals and a circuit between said first and third terminals simultaneously.

18. The relay switching circuit defined in claim 9, wherein the operations of said switching means are in response to externally derived condition responsive signals.

* * * * *